United States Patent
Akai et al.

(10) Patent No.: US 7,790,585 B2
(45) Date of Patent: Sep. 7, 2010

(54) ANTIFERROMAGNETIC HALF-METALLIC SEMICONDUCTOR AND MANUFACTURING METHOD THEREFOR

(75) Inventors: Hisazumi Akai, Suita (JP); Masako Ogura, Suita (JP)

(73) Assignee: Osaka University, Suita-shi (JP)

( * ) Notice: Subject to any disclaimer, the term of this patent is extended or adjusted under 35 U.S.C. 154(b) by 683 days.

(21) Appl. No.: 11/573,509

(22) PCT Filed: Sep. 9, 2005

(86) PCT No.: PCT/JP2005/017100

§ 371 (c)(1), (2), (4) Date: Feb. 9, 2007

(87) PCT Pub. No.: WO2006/028299

PCT Pub. Date: Mar. 16, 2006

(65) Prior Publication Data
US 2009/0224340 A1 Sep. 10, 2009

(30) Foreign Application Priority Data
Sep. 10, 2004 (JP) .............................. 2004-263479

(51) Int. Cl.
H01L 21/04 (2006.01)
(52) U.S. Cl. .................. 438/510; 438/514; 257/421; 257/E29.323

(58) Field of Classification Search ................ 257/183, 257/295; 438/785, 404, 542
See application file for complete search history.

(56) References Cited

U.S. PATENT DOCUMENTS
2004/0112278 A1* 6/2004 Yoshida et al. ............... 117/30

FOREIGN PATENT DOCUMENTS
| JP | 2003-137698 A | 5/2003 |
| JP | 2004-14806 A | 1/2004 |
| JP | 3537086 B2 | 6/2004 |

OTHER PUBLICATIONS

T. Kamatani*, H. Akai The magnetic properties in transition metal-doped chalcopyrite semiconductors Materials Science in Semiconductor Processing 6 (2003) 389-391.*

(Continued)

Primary Examiner—Thanh V Pham
Assistant Examiner—Mark A Laurenzi, III
(74) Attorney, Agent, or Firm—Westerman, Hattori, Daniels & Adrian, LLP

(57) ABSTRACT

An antiferromagnetic half-metallic semiconductor of the present invention is manufactured by adding to a semiconductor two or more types of magnetic elements including a magnetic element with a d-electron number of less than five and a magnetic element with a d-electron number of more than five, and substituting a part of elements of the semiconductor with the two or more types of magnetic elements.

11 Claims, 13 Drawing Sheets

OTHER PUBLICATIONS

K. Sato et al.; "Novel Mn-doped chalcopyrites"; Elsevier, Journal of Physics and Chemistry of Solids; vol. 64, pp. 1461-1468, 2003. Cited in the int'l. search report.

H. van Leuken et al.; "Half-Metallic Antiferromagnets"; Physical Review Letters, The American Physical Society, vol. 74, No. 7, pp. 1171-1173, Feb. 13, 1995.

Warren E. Pickett; "Spin-density-functional-based search for half-metallic antiferromagnets", Physical Review B, vol. 57, No. 17, pp. 10613-10619, May 1, 1998.

International Search Report of PCT/JP2005/017100, date of mailing: Dec. 13, 2005.

European Search Report dated Dec. 11, 2008, issued in corresponding European Patent Application No. 05783704.9.

Cho, Sunglae et al.; "Room-Temperature Ferromagnetism in $(Zn_{1-x}Mn_x)GeP_2$ Semiconductors"; Physical Review Letters, vol. 88, No. 25, 2002.

Yi, Hongsuk et al.; "Mn-doped $ZnSnAs_2$ chalcopyrites: an ab initio study of antiferromagnetic semiconductors"; Journal of Magnetism and Magnetic Materials, vol. 272-276 pp. e243-e244, 2004.

Zhao, Yu-Jun et al; "Possible impurity-induced ferromagnetism in II-Ge-$V_2$ Chalcopyrite semiconductors"; Physical Review B, vol. 65, No. 9, Mar. 2002.

K. Sato et al. "Novel Mn-doped Chalcopyrites" Department of Applied Physics, Tokyo University of Agriculture and Technology, p. 1461-1468, vol. 64, No. 9-10, 2003.

Japanese Office Action dated Feb. 22, 2010, issued in corresponding Japanese Patent Application No. 2006-535214.

* cited by examiner

ANTIFERROMAGNETIC HALF-METALLIC SEMICONDUCTOR AND MANUFACTURING METHOD THEREFOR

TECHNICAL FIELD

The present invention relates to an antiferromagnetic half-metallic semiconductor, and a manufacturing method therefor, which is antiferromagnetic and half-metallic, which shows metallic properties in one of up and down electronic spin states, but shows insulating or semiconducting properties in the other electronic spin state.

BACKGROUND ART

Conventionally known as a ferromagnetic half-metallic magnet (hereinafter referred to as a half-metallic ferromagnet) are Heusler alloys, perovskite-type manganese oxides, zinc-blend-type CrAs, diluted magnetic semiconductors, etc. Semiconductor materials using electron charges and spins, namely spintronics materials, have been studied in recent years. Spintronics materials include zinc-blend-type CrAs and diluted magnetic semiconductors. Known as a diluted magnetic semiconductor are, for example, (In, Mn)As and (Ga, Mn)As.

In contrast, de Groot et al. pointed out in 1995 the possibility of existence of an antiferromagnetic half-metallic magnet (hereinafter referred to as a half-metallic antiferromagnet) (H. van Leuken and de Groot, Phys. Rev. Lett. 74 (1995) 1171). Thereafter, Picket proposed $La_2VCuO_6$ and $La_2MnVO_6$ having a double perovskite structure from electronic state calculations (W. Picket, Phys. Rev. Lett. 77 (1996) 3185).

However, the half-metallic antiferromagnet proposed by Picket is a transition metal oxide based intermetallic compound, but not a semiconductor based spintronics material. In fact, no one has manufactured or proposed a half-metallic antiferromagnet as a spintronics material.

Accordingly, an object of the present invention is to provide an antiferromagnetic half-metallic semiconductor, and a manufacturing method therefor, which is a new antiferromagnetic and half-metallic spintronics material.

SUMMARY OF THE INVENTION

An antiferromagnetic half-metallic semiconductor of the present invention is manufactured by adding to a semiconductor two or more types of magnetic elements including a magnetic element with a d-electron number of less than five and a magnetic element with a d-electron number of more than five, and substituting a part of elements of the semiconductor with the two or more types of magnetic elements.

In a first specific configuration, two types of magnetic elements are added, wherein a d-electron number of one magnetic element is the same or approximately the same as a positive hole number of the other magnetic element. Specifically, the two types of magnetic elements are any one combination selected from the group of Ti and Ni, V and Co, Cr and Fe, Ti and Fe, Ti and Co, V and Fe, V and Ni, Cr and Co, Cr and Ni, Fe and Co, Mn and Fe, Mn and Co, V and Mn, and Cr and Mn. Mn has a d-electron number of less than five or more than five, depending on the host semiconductor or a magnetic element combined therewith.

The following can be a reason why antiferromagnetism and half-metallicity are exhibited by adding to a semiconductor two or more types of magnetic elements including a magnetic element with a d-electron number of less than five and a magnetic element with a d-electron number of more than five, as described above. In the following description, the two types of magnetic elements are V and Co.

FIG. 22 and FIG. 23 show density-of-states curves of V and Co in the case of V and Co with parallel magnetic moments, and density-of-states curves after coupling of V and Co, respectively. FIG. 24 and FIG. 25 show density-of-states curves of V and Co in the case of V and Co with antiparallel magnetic moments, and density-of-states curves after coupling of V and Co, respectively. In the drawings, a longitudinal axis represents a magnitude of energy, with a curve to the left of the longitudinal axis representing a density of states of up spin electrons, and a right curve a density of states of down spin electrons. Hatching of oblique lines in the drawings represents that d-orbitals contain electrons.

In the case of V and Co with parallel magnetic moments, both up spin electrons and down spin electrons of V and Co move between two states of V and Co having an energy difference depending on the electron number, as indicated by thinner arrows in FIG. 22, to couple V and Co. FIG. 23 shows curves representing a density of states of the up spin electrons and down spin electrons after coupling. At this time, the electron energy is slightly decreased as a whole. This implies that the ferromagnetic coupling of V and Co with parallel magnetic moments is stabilized with the electron energy being decreased due to superexchange interaction.

In contrast, in the case of V and Co with antiparallel magnetic moments, up spin electrons of V and Co move between two states of V and Co without any energy difference, as indicated by a thinner arrow in FIG. 24, to couple V and Co. FIG. 25 shows curves representing a density of states of the up spin electrons and down spin electrons after coupling. At this time, the electron energy is decreased as a whole. This implies that the antiferromagnetic coupling of V and Co with antiparallel magnetic moments is stabilized with the electron energy being decreased due to double exchange interaction.

Generally, double exchange interaction is stronger than superexchange interaction. Probably therefore, antiferromagnetic coupling is more stable than ferromagnetic coupling, so that V and Co are coupled together with their magnetic moments being antiparallel. Both the d-electron number of V and the positive hole number of Co are the same number of three. Probably therefore, the magnetic moments of V and Co compensate each other to exhibit antiferromagnetism.

In the case of V and Co with parallel magnetic moments as shown in FIG. 22, the energy difference between the up spin electrons of V and Co, and the energy difference between the down spin electrons of V and Co are relatively small. Therefore, both the up spin electrons and down spin electrons of V and Co move between v and Co, so that the density of states of the up spin electrons and down spin electrons will be represented by the curves shown in FIG. 23 as described above. As illustrated, both of the up spin electrons and down spin electrons have a density of states more than zero near the Fermi energy $E_F$, so that half-metallicity will probably not be exhibited.

In contrast, in the case of V and Co with antiparallel magnetic moments as shown in FIG. 24, the down spin electrons hardly move between V and Co because the energy difference between the down spin electrons of V and Co is great. Only the up spin electrons move between V and Co, so that the density of states of the up spin electrons and down spin electrons will be represented by the curves shown in FIG. 25 as described above. As illustrated, the down spin electrons have a density of states of zero to form a band gap Gp. The Fermi energy $E_F$ is present in the band gap. On the other hand, the up spin electrons have a density of states greater than zero near the Fermi energy $E_F$, so that half-metallicity will probably be exhibited.

First-principles electronic state calculations have confirmed that antiferromagnetism and half-metallicity are exhibited as described above.

Antiferromagnetism is exhibited as described above if the d-electron number of one of two types of magnetic elements is the same as the positive hole number of the other magnetic element. If the d-electron number of one magnetic element and the positive hole number of the other magnetic element are not completely the same but approximately the same, ferrimagnetism having slight magnetism as a whole is probably exhibited because the two types of magnetic elements have slightly different magnitudes of magnetic moments. In the present specification, "antiferromagnetism" includes "ferrimagnetism" having slight magnetism.

In a second specific configuration, three types of magnetic elements are add, wherein a total d-electron number of any two types of magnetic elements is the same or approximately the same as a positive hole number of one type of magnetic element other than the two types of magnetic elements. Specifically, the three types of magnetic elements are any one combination selected from the group of Ti, V, and Ni, Ti, V, and Co, Ti, Ni, and Co, V, Ni, and Co, Cr, Mn, and Co, and V, Mn, and Fe.

In the above specific configuration, two of the three types of magnetic elements are ferromagnetically coupled with their magnetic moments being parallel, and the two types of magnetic elements and the other one type of magnetic element are antiferromagnetically coupled with their magnetic moments being antiparallel. A total d-electron number of the two types of magnetic elements is the same or the approximately same as a positive hole number of the one type of magnetic element other than the two types of magnetic elements. Therefore, antiferromagnetism is exhibited as in the first specific configuration where two types of magnetic elements are added.

If the three types of magnetic elements are Ti, V, and Ni, then Ti and V are ferromagnetically coupled, while Ni is antiferromagnetically coupled with Ti and V. In the case of Ti, V, and Co, Ti and V are ferromagnetically coupled, while Co is antiferromagnetically coupled with Ti and V. In the case of Ti, Ni, and Co, Ni and Co are ferromagnetically coupled, while Co is antiferromagnetically coupled with Ti and Ni. In the case of V, Ni, and Co, Ni and Co are ferromagnetically coupled, while V is antiferromagnetically coupled with Ni and Co. Further, if the three types of magnetic elements are Cr, Mn, and Co, then Co and Mn are ferromagnetically coupled, while Cr is antiferromagnetically coupled with Co and Mn. If the three types of magnetic elements are V, Mn, and Fe, then V and Mn are ferromagnetically coupled, while Fe is antiferromagnetically coupled with V and Mn.

As described above, the antiferromagnetic half-metallic semiconductor and manufacturing method therefor of the present invention can realize a new antiferromagnetic and half-metallic spintronics material.

BEST MODE FOR CARRYING OUT THE INVENTION

Figure 1:
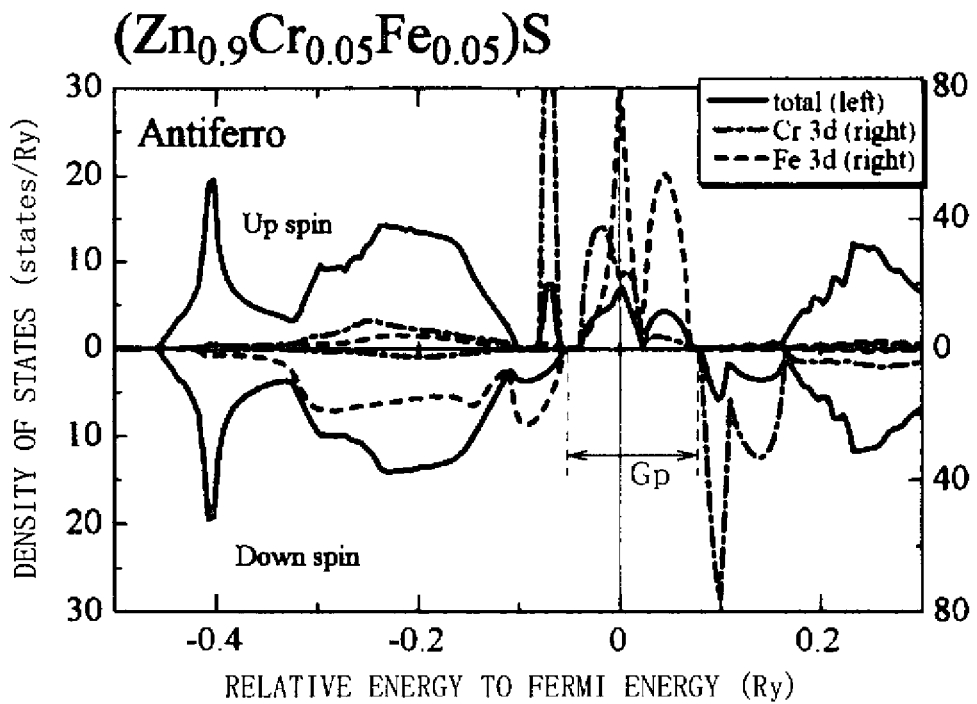
FIG. 1 is a graph showing electronic densities of states of a semiconductor represented by a composition formula $(Zn_{0.9}Cr_{0.05}Fe_{0.05})S$ in an antiferromagnetic state.

Embodiments of the present invention will be specifically described below with reference to the drawings.

An antiferromagnetic half-metallic semiconductor of the present invention has a part of elements of the semiconductor substituted with two or more types of magnetic elements including a magnetic element with a d-electron number of less than five and a magnetic element with a d-electron number of more than five.

The antiferromagnetic half-metallic semiconductor of the present invention is manufactured by growing a host semiconductor thin film on a substrate, and simultaneously adding several % each of two or more types of magnetic elements including a magnetic element with a d-electron number of less than five and a magnetic element with a d-electron number of more than five.

Examples of the host semiconductor to be employed include II-VI compound semiconductors, III-V compound semiconductors, I-III-VI compound semiconductors having a chalcopyrite-type crystal structure, II-IV-V compound semiconductors having a chalcopyrite-type crystal structure, and oxide semiconductors. Examples of a II-VI compound semiconductor to be employed may include ZnO, ZnSe, ZnS, ZnTe, and CdTe. Examples of a III-V compound semiconductor to be employed may include GaAs, GaN, InAs, AlAs, InSb, GaSb, GaP, and InP. Examples of a chalcopyrite-type I-III-VI compound semiconductor to be employed may include $CuAlS_2$, $AgCaS_2$, and $AgGaS_2$. Examples of a chalcopyrite-type II-IV-V compound semiconductor to be employed may include $CdGeP_2$, $ZnGeP_2$, and $CdGeAs_2$. Further, an example of an oxide semiconductor to be employed may include $TiO_2$.

Known thin film growth methods may be employed including an MBE (Molecular Beam Epitaxy) method, a laser MBE method, a low-temperature MBE method, and an MOCVD (Metal Organic Chemical Vapour Deposition) method. It is desirable to employ a low-temperature MBE method if a III-V compound semiconductor is grown as a semiconductor thin film on a substrate.

Further, the magnetic elements to be added are two types of transition metal elements, and a d-electron number of one magnetic element is the same or approximately the same as a positive hole number of the other magnetic element. The two types of transition metal elements are one combination selected from the group of, for example, Ti and Ni, V and Co, Cr and Fe, Ti and Fe, Ti and Co, V and Fe, V and Ni, Cr and Co, Cr and Ni, Fe and Co, Mn and Fe, Mn and Co, V and Mn, and Cr and Mn. Three types of transition metal elements may also be used. The three types of transition metal elements are one combination selected from the group of, for example, Ti, V, and Ni, Ti, V, and Co, Ti, Ni, and Co, V, Ni, and Co, Cr, Mn, and Co, and V, Mn, and Fe.

According to the above manufacturing method, while a semiconductor thin film is growing, a part of elements of the semiconductor thin film is substituted with two or more types of magnetic elements to provide an antiferromagnetic and half-metallic semiconductor.

If a II-VI compound semiconductor thin film is grown as a semiconductor thin film, then a II element is substituted with the magnetic elements. If a III-V compound semiconductor thin film is grown, then a III element is substituted with the magnetic elements. If a chalcopyrite-type I-III-VI compound semiconductor thin film is grown, then a III element is substituted with the magnetic elements. If a chalcopyrite-type II-IV-V compound semiconductor is grown, then a II element is substituted with the magnetic elements.

The following can be a reason why antiferromagnetism and half-metallicity are exhibited. In the following description, the two types of magnetic elements are V and Co.

Figure 22:
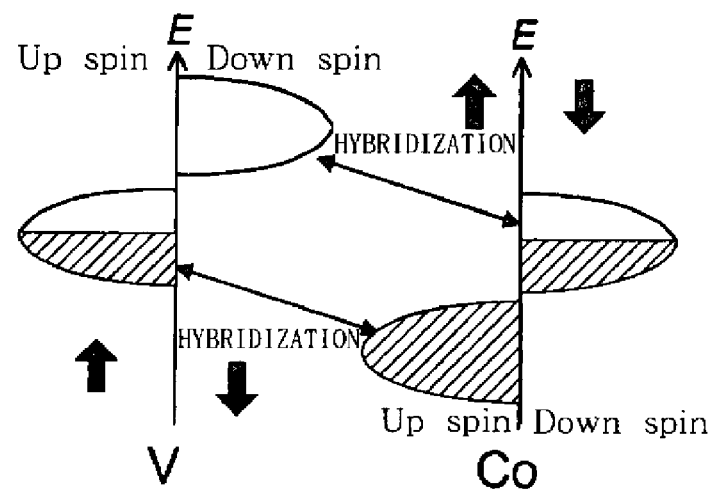
FIG. 22 illustrates density-of-states curves of V and Co in the case of V and Co with parallel magnetic moments.
Figure 23:
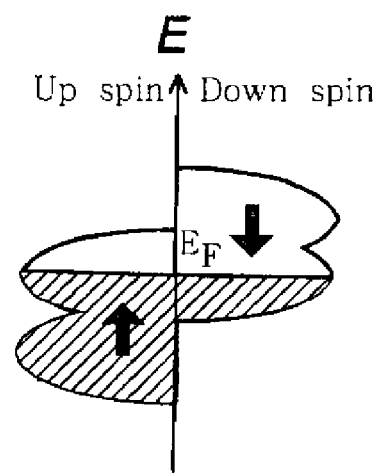
FIG. 23 illustrates density-of-states curves after coupling of V and Co in the above case.
Figure 24:
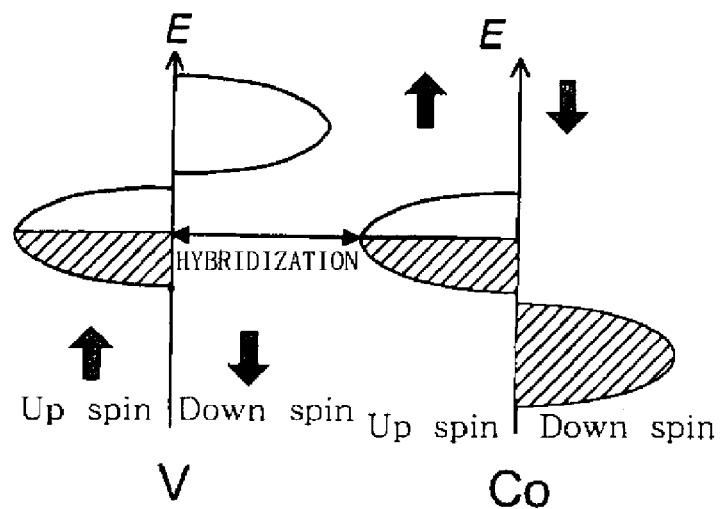
FIG. 24 illustrates density-of-states curves of V and Co in the case of V and Co with antiparallel magnetic moments.

That is, as shown in FIG. 22, in the case of V and Co with parallel magnetic moments, the ferromagnetic coupling is stabilized probably due to superexchange interaction. On the other hand, as shown in FIG. 24, in the case of V and Co with antiparallel magnetic moments, the antiferromagnetic coupling is stabilized probably due to double exchange interaction. Generally, double exchange interaction is stronger than superexchange interaction. Probably therefore, antiferromagnetic coupling is more stable than ferromagnetic coupling, so that V and Co are coupled together with their magnetic moments being antiparallel. Both the d-electron number of V and the positive hole number of Co are the same number of three. Probably therefore, the magnetic moments of V and Co compensate each other to exhibit antiferromagnetism.

Figure 25:
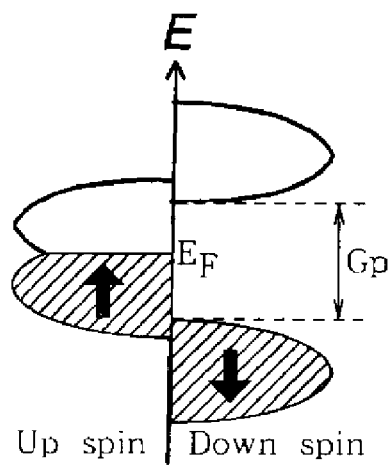
FIG. 25 illustrates density-of-states curves after coupling of V and Co in the above case.

In the case of V and Co with antiparallel magnetic moments as shown in FIG. 24, the down spin electrons hardly move between V and Co because the energy difference between the down spin electrons of V and Co is great. Only the up spin electrons move between V and Co, so that the density of states of the up spin electrons and down spin electrons will be represented by curves shown in FIG. 25. As illustrated, the down spin electrons have a density of states of zero to form a band gap Gp. The Fermi energy $E_F$ is present in the band gap. On the other hand, the up spin electrons have a density of states more than zero near the Fermi energy $E_F$, so that half-metallicity will probably be exhibited.

First-principles electronic state calculations have confirmed that antiferromagnetism and half-metallicity are exhibited.

Antiferromagnetism is exhibited as described above if the d-electron number of one of two types of magnetic elements is the same as the positive hole number of the other magnetic element. If the d-electron number of one magnetic element and the positive hole number of the other magnetic element are not completely the same but approximately the same, ferrimagnetism having slight magnetism as a whole is probably exhibited because the two types of magnetic elements have slightly different magnitudes of magnetic moments. For example, $(Zn_{0.9}Cr_{0.05}Co_{0.05})S$ is ferromagnetic, but can be antiferromagnetic by being adjusted in concentrations of Cr and Co.

If three types of transition metal elements are used, the three types of transition metal elements are adjusted in concentration such that a total d-electron number of any two of the three types of transition metal elements is the same or approximately the same as a positive hole number of one type of magnetic element other than the two types of magnetic elements to thereby provide an antiferromagnetic semiconductor. For example, $(Zn_{0.9}Cr_{0.05}Mn_{0.025}Co_{0.025})S$ is made antiferromagnetic by adding 5% of Cr and 2.5% each of Mn and Co to ZnS to equalize the total d-electron number of Mn and Co to the positive hole number of Cr. $(Zn_{0.9}V_{0.025}Mn_{0.025}Fe_{0.05})S$ is made antiferromagnetic by adding 5% of Fe and 2.5% each of Mn and V to ZnS to equalize the total d-electron number of Mn and Fe to the positive hole number of V.

The antiferromagnetic half-metallic semiconductor of the present invention is antiferromagnetic and insensitive to external magnetic fields, and therefore expected to be applied to different devices from those of ferromagnetic spintronics materials, which are sensitive to external magnetic fields. For example, applications are possible to MRAMs (Magnetic Random Access Memory), sensors, spin injection devices, magneto-optical devices, spin transistors, spin FETS, single-spin superconductors, etc. The antiferromagnetic half-metallic semiconductor of the present invention is half-metallic, and therefore can provide a high switching speed when applied to a semiconductor switching device.

First Embodiment

A diluted antiferromagnetic half-metallic semiconductor of the present embodiment is represented by a composition formula $(Zn_{0.9}Cr_{0.05}Fe_{0.05})S$, and has a part of a II element Zn of a II-VI compound semiconductor of ZnS substituted with transition metal elements of Cr and Fe.

A manufacturing method for the diluted antiferromagnetic half-metallic semiconductor includes growing a ZnS thin film on a GaAs(100) substrate with a laser MBE method, and simultaneously irradiating Cr gas and Fe gas toward the substrate to add 5% each of Cr and Fe. At this time, the substrate temperature is set, for example, to 150-200° C., with a Zn molecular beam having a beam pressure of, for example, $2.5 \times 10^{-5}$ to $8 \times 10^{-5}$ Pa, and an S molecular beam having a beam pressure of, for example, $1.5 \times 10^{-4}$ to $12 \times 10^{-4}$ Pa. The gas pressure of Cr and Fe is set, for example, to $2.5 \times 10^{-6}$ to $15 \times 10^{-6}$ Pa.

The present inventors performed first-principles electronic state calculations in order to confirm that the above manufacturing method exhibits half-metallicity and antiferromagnetism. A method of the first-principles electronic state calculations employed here is a known KKR-CPA-LDA method, which is a combination of the KKR (Korringa-Kohn-Rostoker) method (also called the Green function method), the CPA (Coherent-Potential Approximation) method, and the LDA (Local-Density Approximation) method.

Figure 2:
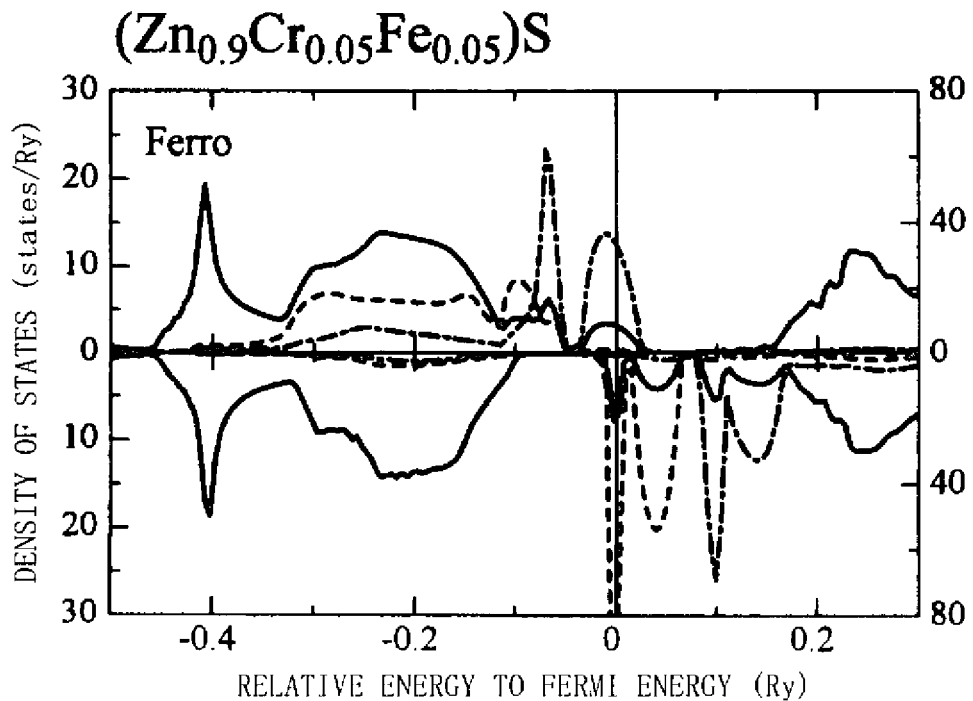
FIG. 2 is a graph showing electronic densities of states of the above semiconductor in a ferromagnetic state.
Figure 3:
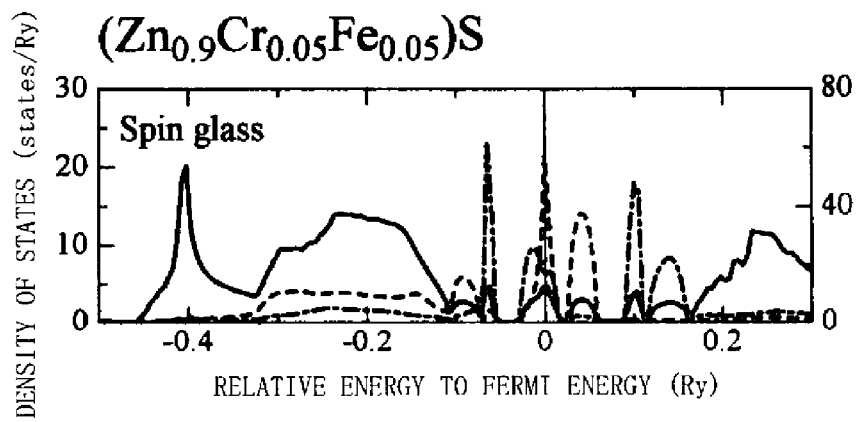
FIG. 3 is a graph showing electronic densities of states of the above semiconductor in a spin glass state.

FIG. 1 through FIG. 3 show density-of-states curves in an antiferromagnetic state, a ferromagnetic state, and a spin glass state with disordered local magnetic moment directions, respectively, obtained by the first-principles electronic state calculations. In the drawings, solid lines represent a total density of states, one-dot chain lines a local density of states of Cr at a 3 d orbital position, and broken lines a local density of states of Fe at a 3 d orbital position. FIG. 3 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 1, the down spin electrons have a density of states of zero to form a band gap Gp. The Fermi energy is present in the band gap. On the other hand, the up spin electrons have a density of states greater than zero near the Fermi energy. Thus, the down spin electron state represents semiconducting properties, while the up spin electron state represents metallic properties, so that it can be said that half-metallicity is exhibited.

In contrast, in the ferromagnetic state, as indicated by solid lines in FIG. 2, both the up spin electrons and down spin electrons have a density of states greater than zero near the Fermi energy, so that it can be said that half-metallicity is not exhibited.

Also in the spin glass state, as indicated by a solid line in FIG. 3, the up spin electrons have a density of states grater than zero near the Fermi energy. The down spin electrons also have a density of states grater than zero near the Fermi energy, so that it can be said that half-metallicity is not exhibited.

When a sum total of electron energy in each of the antiferromagnetic state, ferromagnetic state and spin glass state was calculated from the above density-of-states curves, the energy was the lowest in the antiferromagnetic state. Therefore, it can be said that the antiferromagnetic state is the most stable to exhibit antiferromagnetism.

Further, an antiferromagnetic transition temperature (Neel temperature) at which an antiferromagnetic state changes to a paramagnetic state was calculated to be 445 K. The antiferromagnetic transition temperature was calculated with mean field approximation from an energy difference between the spin glass state and antiferromagnetic state, as in a known method for calculating a ferromagnetic transition temperature (Curie temperature) at which a ferromagnetic state changes to a paramagnetic state.

Figure 4:
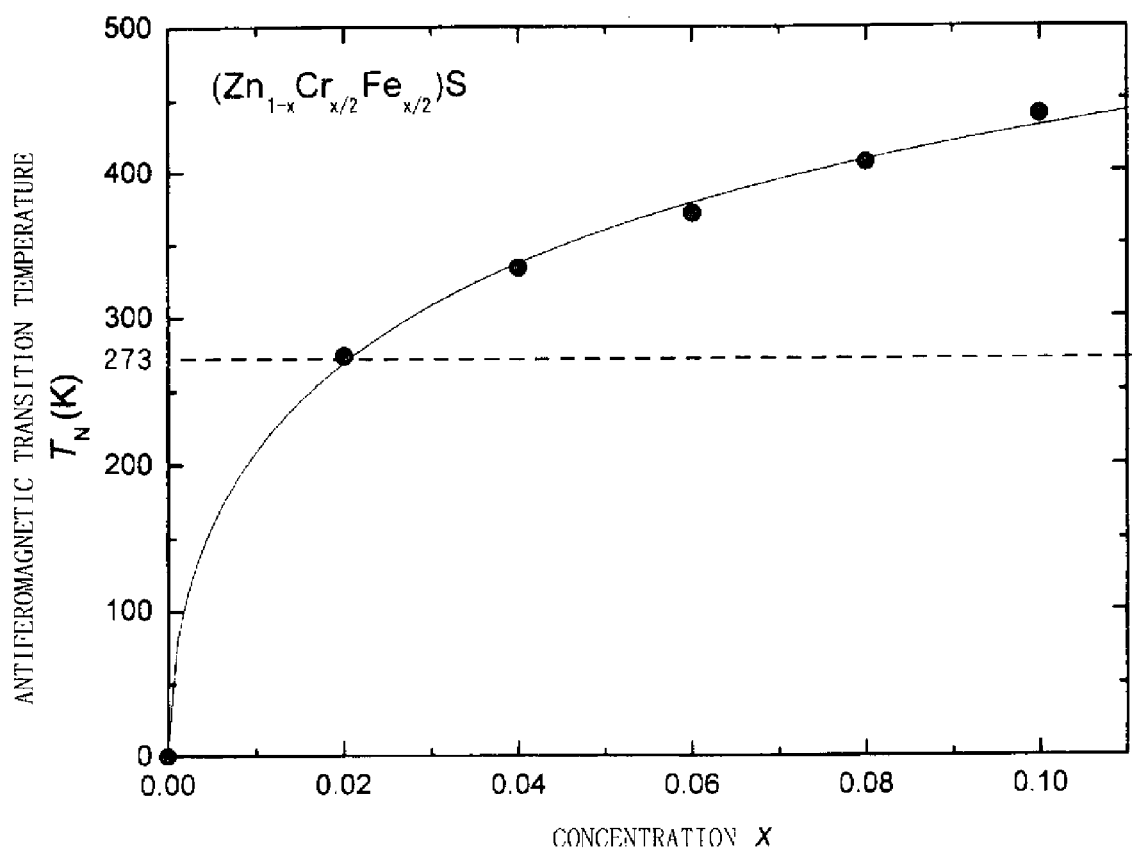
FIG. 4 is a graph showing a relationship between a concentration of Cr and Fe and an antiferromagnetic transition temperature.

Furthermore, concentrations of Cr and Fe were changed and an antiferromagnetic transition temperature at each concentration was calculated. FIG. 4 shows a calculation result of the antiferromagnetic transition temperature. Plots in the drawing represent calculation values of the antiferromagnetic transition temperature when x in a composition formula represented as $(Zn_{1-x}Cr_{x/2}Fe_{x/2})S$ is 0.02, 0.04, 0.06, 0.08, or 0.10. The curve is an approximate curve connecting these plots. As illustrated, x of 0.02 or more can provide an antiferromagnetic transition temperature of 273 K (=0° C.) or more.

As described above, the diluted antiferromagnetic half-metallic semiconductor of the present embodiment has an antiferromagnetic transition temperature (445 K) higher than room temperature, and therefore can be used in devices that operate at room temperature or more.

Second Embodiment

A diluted antiferromagnetic half-metallic semiconductor of the present embodiment is represented by a composition formula $(Zn_{0.9}V_{0.05}Co_{0.05})S$, and has a part of a II element Zn of a II-VI compound semiconductor of ZnS substituted with transition metal elements of v and Co.

A manufacturing method for the diluted antiferromagnetic half-metallic semiconductor includes growing a ZnS thin film on a GaAs(100) substrate with a laser MBE method, and simultaneously adding 5% each of V and Co.

The present inventors performed first-principles electronic state calculations, as in the first embodiment, in order to confirm that the above manufacturing method exhibits half-metallicity and antiferromagnetism.

Figure 5:
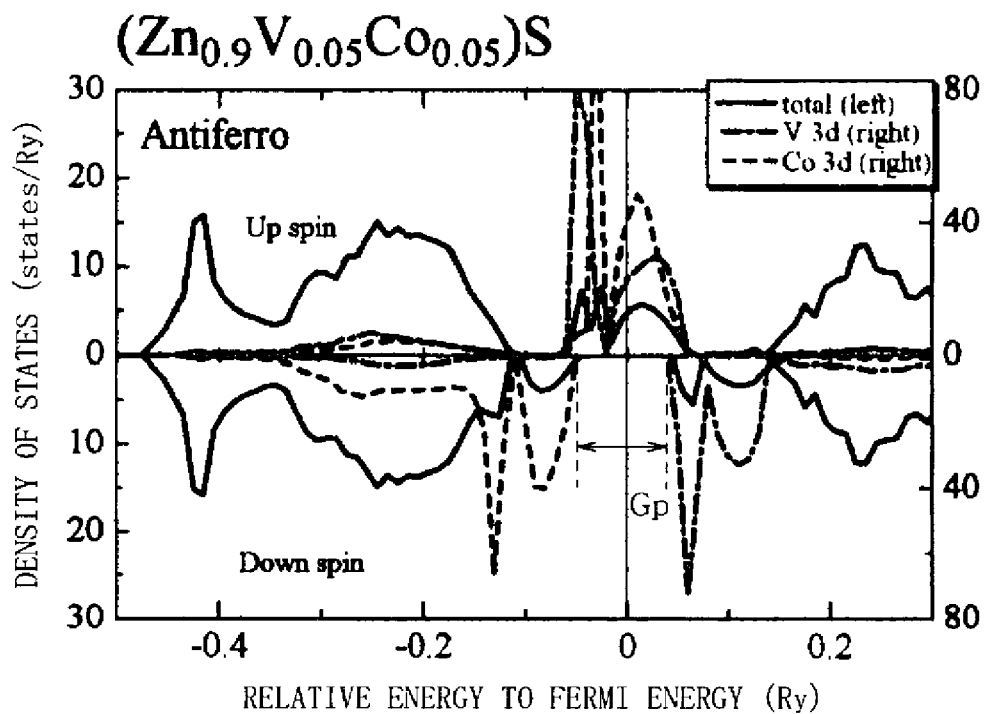
FIG. 5 is a graph showing electronic densities of states of a semiconductor represented by a composition formula $(Zn_{0.09}V_{0.05}Co_{0.05})S$ in an antiferromagnetic state.
Figure 6:
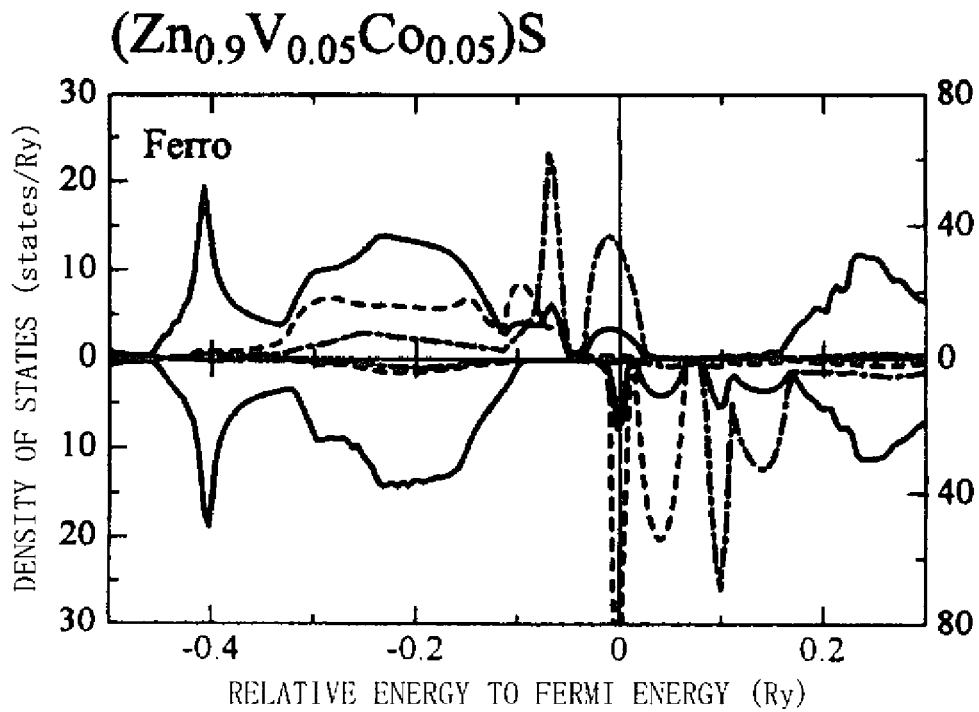
FIG. 6 is a graph showing electronic densities of states of the above semiconductor in a ferromagnetic state.
Figure 7:
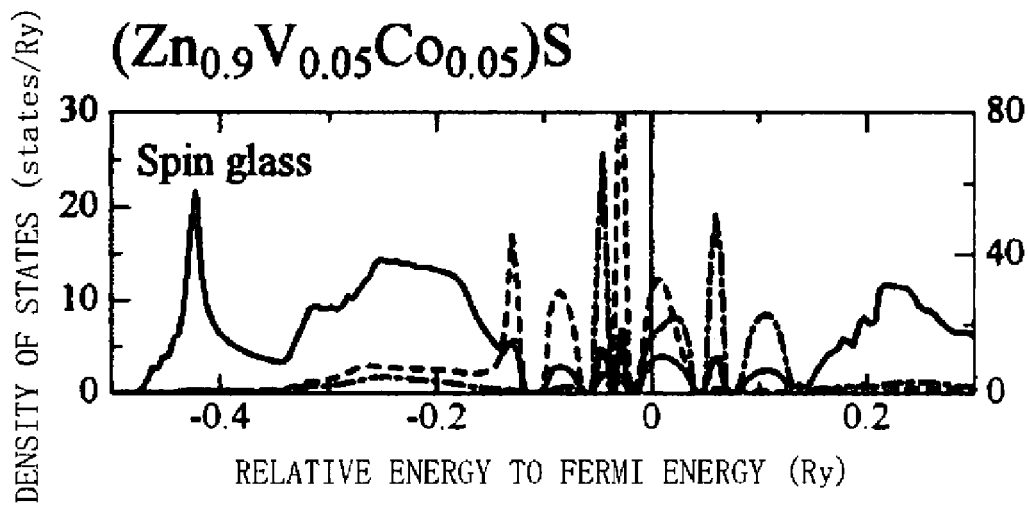
FIG. 7 is a graph showing electronic densities of states of the above semiconductor in a spin glass state.

FIG. 5 through FIG. 7 show density-of-states curves in an antiferromagnetic state, a ferromagnetic state and a spin glass state, respectively, obtained by the first-principles electronic state calculations. In the drawings, solid lines represent a total density of states, one-dot chain lines a local density of states of V at a 3 d orbital position, and broken lines a local density of states of Co at a 3 d orbital position. FIG. 7 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 5, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

In contrast, in the ferromagnetic state, as indicated by solid lines in FIG. 6, both the up spin electrons and down spin electrons have a density of states greater than zero near the Fermi energy, so that it can be said that half-metallicity is not exhibited.

Also in the spin glass state, as indicated by a solid line in FIG. 7, the up spin electrons have a density of states grater than zero near the Fermi energy. The down spin electrons also have a density of states grater than zero near the Fermi energy, so that it can be said that half-metallicity is not exhibited.

When a sum total of electron energy in each of the antiferromagnetic state, ferromagnetic state and spin glass state was calculated from the above density-of-states curves, the energy was the lowest in the antiferromagnetic state. Therefore, it can be said that the antiferromagnetic state is the most stable to exhibit antiferromagnetism.

Further, an antiferromagnetic transition temperature was calculated to be 349 K. Thus, the diluted antiferromagnetic half-metallic semiconductor of the present embodiment has an antiferromagnetic transition temperature higher than room temperature, and therefore can be used in devices that operate at room temperature or more.

Third Embodiment

A diluted antiferromagnetic half-metallic semiconductor of the present embodiment is represented by a composition formula $(Zn_{0.9}Cr_{0.05}Co_{0.05})O$, and has a part of a II element Zn of a II-VI compound semiconductor of ZnO substituted with transition metal elements of Cr and Co.

A manufacturing method for the diluted antiferromagnetic half-metallic semiconductor includes growing a ZnO thin film on a GaAs(100) substrate with a laser MBE method, and simultaneously adding 5% each of Cr and Co.

The present inventors performed first-principles electronic state calculations, as in the first embodiment, in order to confirm that the above manufacturing method exhibits half-metallicity and antiferromagnetism.

Figure 8:
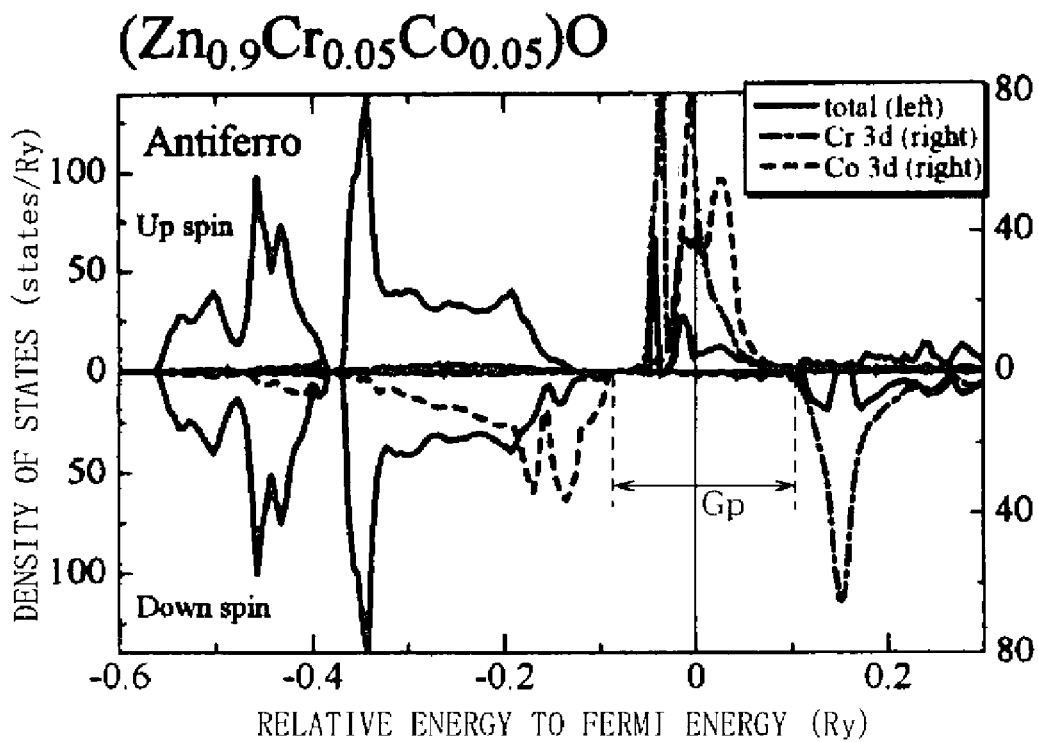
FIG. 8 is a graph showing electronic densities of states of a semiconductor represented by a composition formula $(Zn_{0.9}Cr_{0.05}Co_{0.05})O$ in an antiferromagnetic state.
Figure 9:
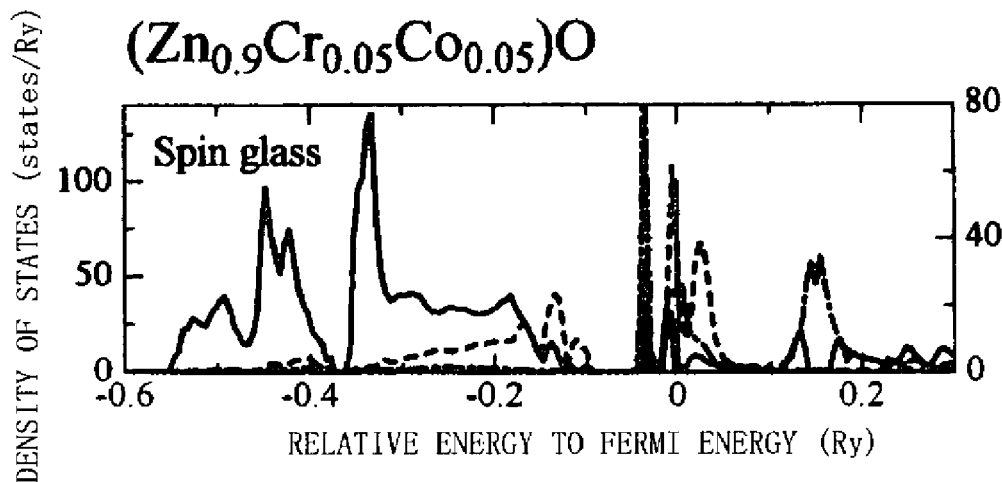
FIG. 9 is a graph showing electronic densities of states of the above semiconductor in a spin glass state.

FIG. 8 and FIG. 9 show density-of-states curves in an antiferromagnetic state and a spin glass state, respectively, obtained by the first-principles electronic state calculations. In the drawings, solid lines represent a total density of states, one-dot chain lines a local density of states of Cr at a 3 d orbital position, and broken lines a local density of states of Co at a 3 orbital position. FIG. 9 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 8, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

In contrast, in the spin glass state, as indicated by a solid line in FIG. 9, the up spin electrons have a density of states grater than zero near the Fermi energy. The down spin electrons also have a density of states grater than zero near the Fermi energy, so that it can be said that half-metallicity is not exhibited. It has been confirmed that half-metallicity is not exhibited also in the ferromagnetic state.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

Further, an antiferromagnetic transition temperature was calculated to be 484 K. Thus, the diluted antiferromagnetic half-metallic semiconductor of the present embodiment has an antiferromagnetic transition temperature higher than room temperature, and therefore can be used in devices that operate at room temperature or more.

Fourth Embodiment

A diluted antiferromagnetic half-metallic semiconductor of the present embodiment is represented by a composition formula $(Zn_{0.9}Cr_{0.05}Fe_{0.05})Se$, and has a part of a II element Zn of a II-VI compound semiconductor of ZnSe substituted with transition metal elements of Cr and Fe.

A manufacturing method for the diluted antiferromagnetic half-metallic semiconductor includes growing a ZnSe thin film on a GaAs(100) substrate with a laser MBE method, and simultaneously adding 5% each of Cr and Fe.

The present inventors performed first-principles electronic state calculations, as in the first embodiment, in order to confirm that the above manufacturing method exhibits half-metallicity and antiferromagnetism.

Figure 10:
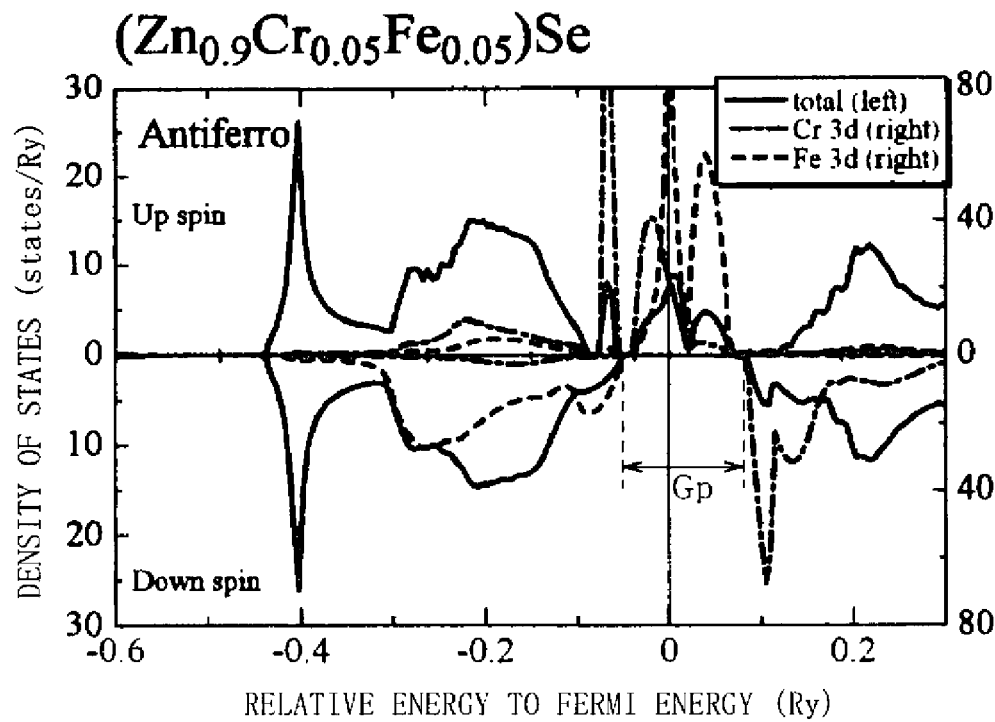
FIG. 10 is a graph showing electronic densities of states of a semiconductor represented by a composition formula $(Zn_{0.9}Cr_{0.05}Fe_{0.05})Se$ in an antiferromagnetic state.
Figure 11:
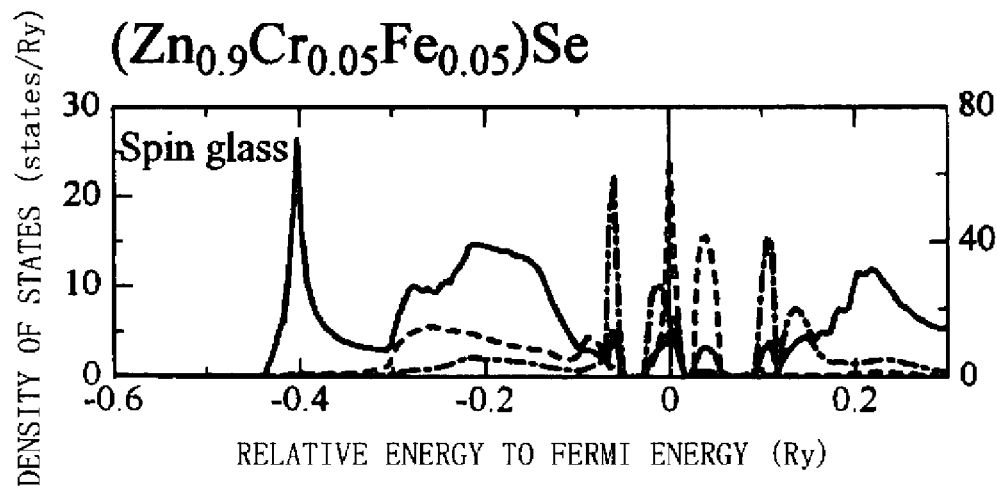
FIG. 11 is a graph showing electronic densities of states of the above semiconductor in a spin glass state.

FIG. 10 and FIG. 11 show density-of-states curves in an antiferromagnetic state and a spin glass state, respectively, obtained by the first-principles electronic state calculations. In the drawings, solid lines represent a total density of states, one-dot chain lines a local density of states of Cr at a 3 d orbital position, and broken lines a local density of states of Fe at a 3 d orbital position. FIG. 11 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 10, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

In contrast, in the spin glass state, as indicated by a solid line in FIG. 11, the up spin electrons have a density of states grater than zero near the Fermi energy. The down spin electrons also have a density of states grater than zero near the Fermi energy, so that it can be said that half-metallicity is not exhibited. It has been confirmed that half-metallicity is not exhibited also in the ferromagnetic state.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

Further, an antiferromagnetic transition temperature was calculated to be 315 K. Thus, the diluted antiferromagnetic half-metallic semiconductor of the present embodiment has an antiferromagnetic transition temperature higher than room temperature, and therefore can be used in devices that operate at room temperature or more.

Fifth Embodiment

A diluted antiferromagnetic half-metallic semiconductor of the present embodiment is represented by a composition formula $(Zn_{0.9}Cr_{0.05}Fe_{0.05})O$, and has a part of a II element Zn of a II-VI compound semiconductor of ZnO substituted with transition metal elements of Cr and Fe.

A manufacturing method for the diluted antiferromagnetic half-metallic semiconductor includes growing a ZnO thin film on a GaAs(100) substrate with a laser MBE method, and simultaneously adding 5% each of Cr and Fe.

The present inventors performed first-principles electronic state calculations, as in the first embodiment, in order to confirm that the above manufacturing method exhibits half-metallicity and antiferromagnetism.

Figure 12:
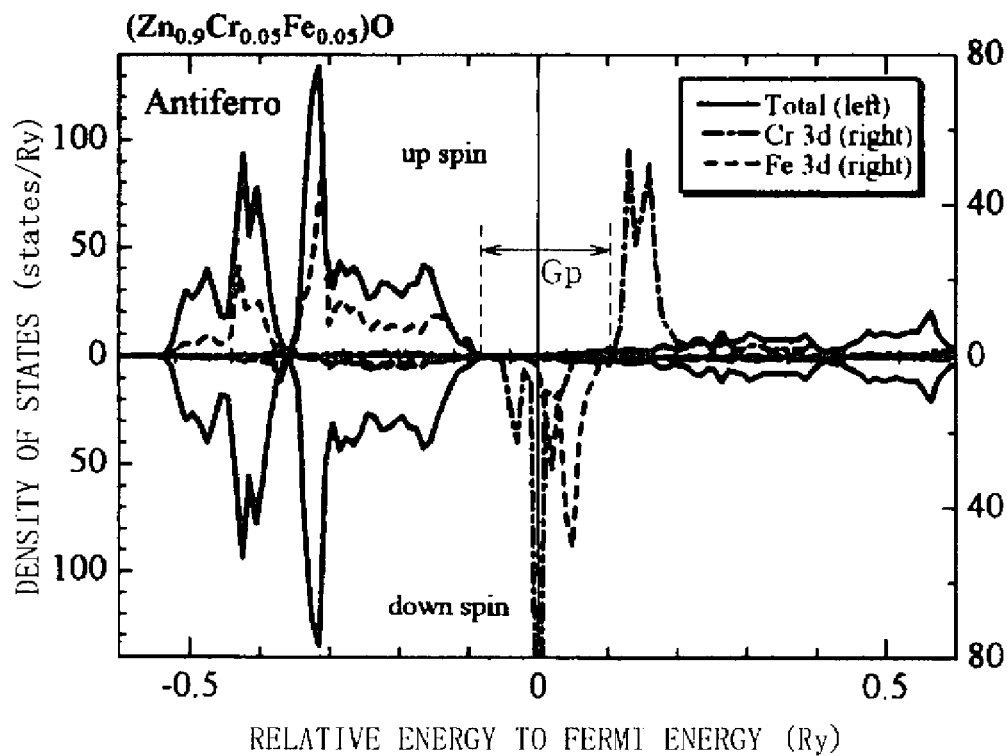
FIG. 12 is a graph showing electronic densities of states of a semiconductor represented by a composition formula $Zn_{0.9}Cr_{0.05}Fe_{0.05})O$ in an antiferromagnetic state.

FIG. 12 shows density-of-states curves in an antiferromagnetic state obtained by the first-principles electronic state calculations. In the drawing, solid lines represent a total density of states, one-dot chain lines a local density of states of Cr at a 3 d orbital position, and broken lines a local density of states of Fe at a 3 d orbital position. As indicated by the solid lines in the drawing, the up spin electrons have a density of states of zero to form a band gap Gp. The Fermi energy is present in the band gap. On the other hand, the down spin electrons have a density of states greater than zero near the Fermi energy. Thus, it can be said that half-metallicity is exhibited. It has been confirmed that half-metallicity is not exhibited in the ferromagnetic state and spin glass state.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

Sixth Embodiment

A diluted antiferromagnetic half-metallic semiconductor of the present embodiment is represented by a composition formula $Cu(Al_{0.9}V_{0.05}Mn_{0.05})S_2$, and has a part of a III element Al of a I-III-VI compound semiconductor of $CuAlS_2$ substituted with transition metal elements of V and Mn.

A manufacturing method for the diluted antiferromagnetic half-metallic semiconductor includes growing a $CuAlS_2$ thin film on a GaAs(100) substrate with a laser MBE method, and simultaneously adding 5% each of V and Mn.

The present inventors performed first-principles electronic state calculations, as in the first embodiment, in order to confirm that the above manufacturing method exhibits half-metallicity and antiferromagnetism.

Figure 13:
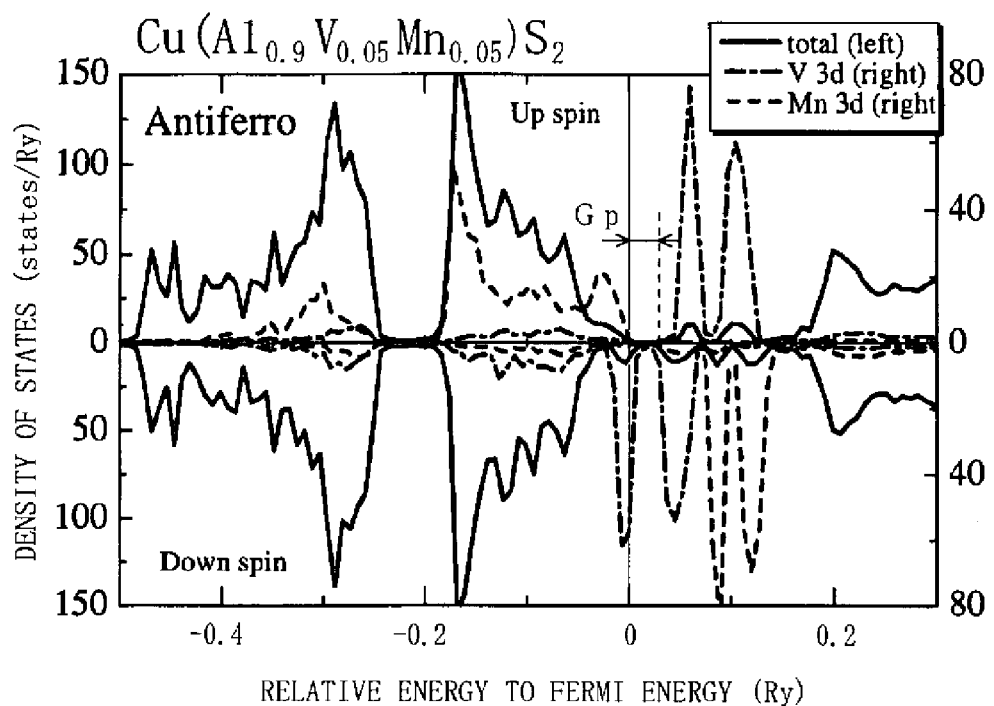
FIG. 13 is a graph showing electronic densities of states of a semiconductor represented by a composition formula $Cu(Al_{0.9}V_{0.05}Mn_{0.05})S_2$ in an antiferromagnetic state.
Figure 14:
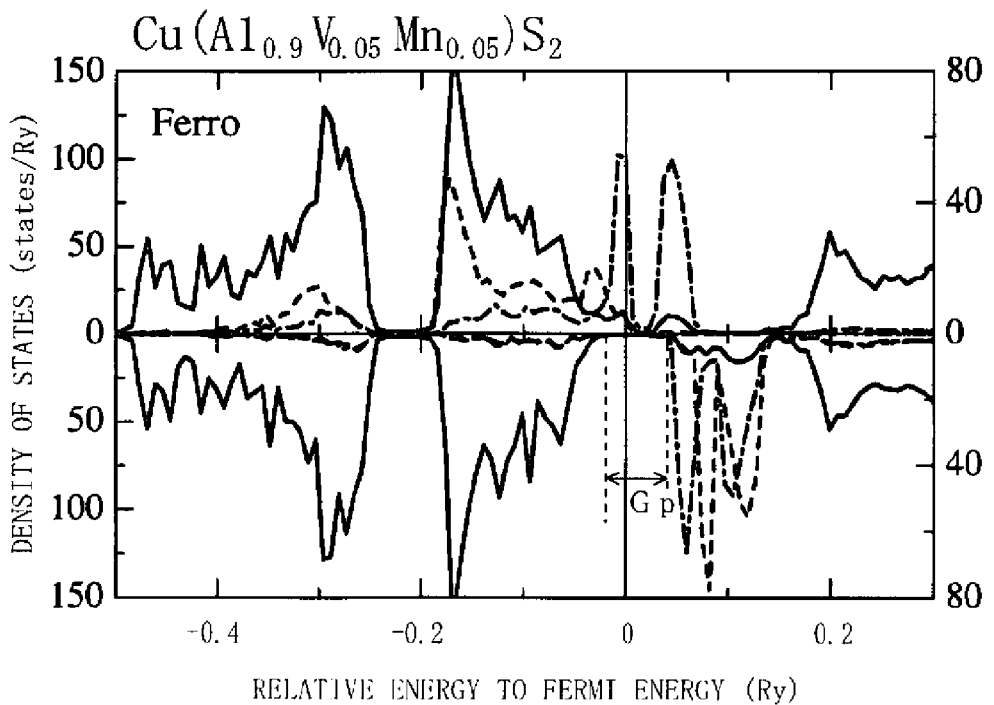
FIG. 14 is a graph showing electronic densities of states of the above semiconductor in a ferromagnetic state.
Figure 15:
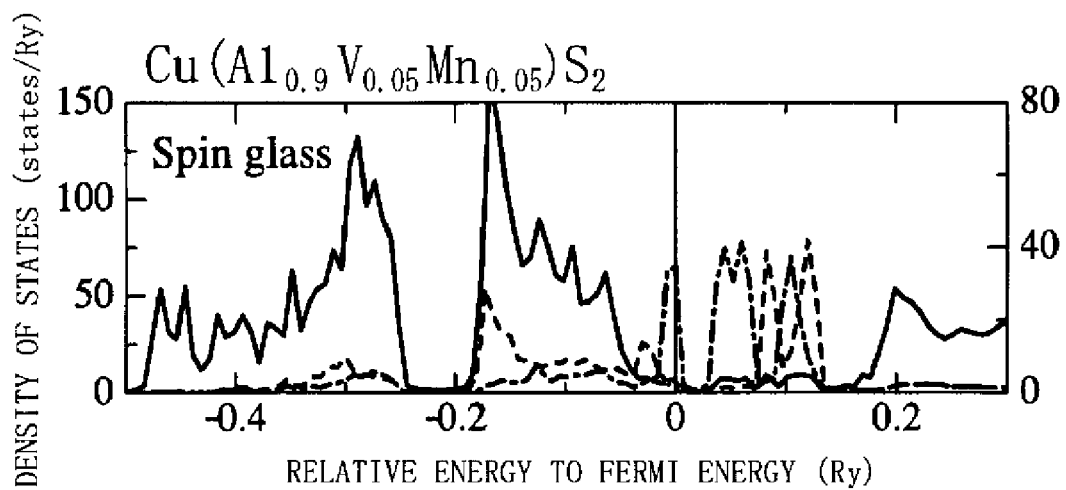
FIG. 15 is a graph showing electronic densities of states of the above semiconductor in a spin glass state.

FIG. 13 through FIG. 15 show density-of-states curves in an antiferromagnetic state, a ferromagnetic state and a spin glass state, respectively, obtained by the first-principles electronic state calculations. In the drawings, solid lines represent a total density of states, one-dot chain lines a local density of states of V at a 3 d orbital position, and broken lines a local density of states of Mn at a 3 d orbital position. FIG. 15 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 13, the up spin electrons have a density of states of zero to form a band gap Gp. The Fermi energy is present in the band gap. On the other hand, the down spin electrons have a density of states greater than zero near the Fermi energy. Thus, it can be said that half-metallicity is exhibited.

In the ferromagnetic state, as indicated by solid lines in FIG. 14, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

In contrast, in the spin glass state, as indicated by a solid line in FIG. 15, the up spin electrons have a density of states grater than zero near the Fermi energy. The down spin electrons also have a density of states grater than zero near the Fermi energy, so that it can be said that half-metallicity is not exhibited.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

The present inventors have confirmed with first-principles electronic state calculations that an antiferromagnetic half-metallic semiconductor can be obtained also by adding to $AgGaS_2$ two types of magnetic elements of Mn and Fe, or two types of magnetic elements of Mn and Co. They also have confirmed with first-principles electronic state calculations that an antiferromagnetic half-metallic semiconductor can be obtained also by adding to $CuAlS_2$ two types of magnetic elements of Cr and Mn, or two types of magnetic elements of Mn and Fe.

Seventh Embodiment

A diluted antiferromagnetic half-metallic semiconductor of the present embodiment is represented by a composition formula $(Zn_{0.09}Cr_{0.05}Mn_{0.025}Co_{0.025})S$, and has a part of a II element Zn of a II-VI compound semiconductor of ZnS substituted with transition metal elements of Cr, Mn, and Co.

A manufacturing method for the diluted antiferromagnetic half-metallic semiconductor includes growing a znS thin film on a GaAs(100) substrate with a laser MBE method, and simultaneously adding 5% of Cr and 2.5% each of Mn and Co.

The present inventors performed first-principles electronic state calculations, as in the first embodiment, in order to confirm that the above manufacturing method exhibits half-metallicity and antiferromagnetism.

Figure 16:
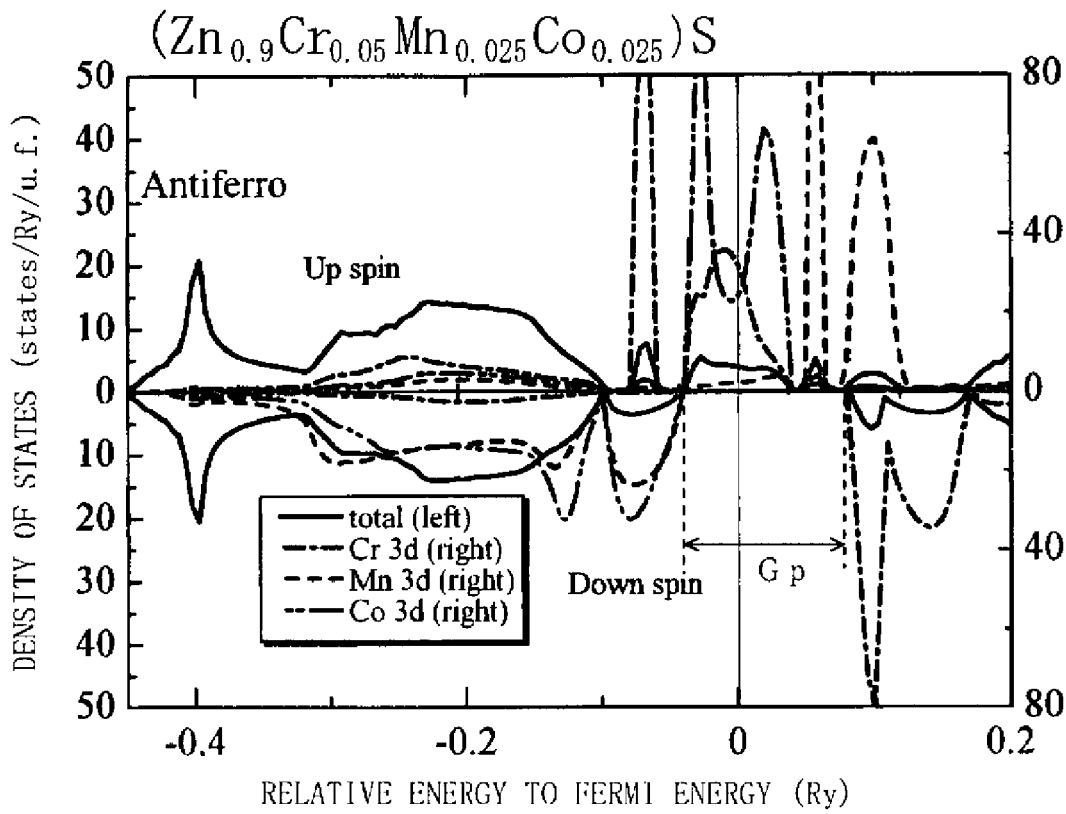
FIG. 16 is a graph showing electronic densities of states of a semiconductor represented by a composition formula $(Zn_{0.9}Cr_{0.05}Mn_{0.025}Co_{0.025})S$ in an antiferromagnetic state.
Figure 17:
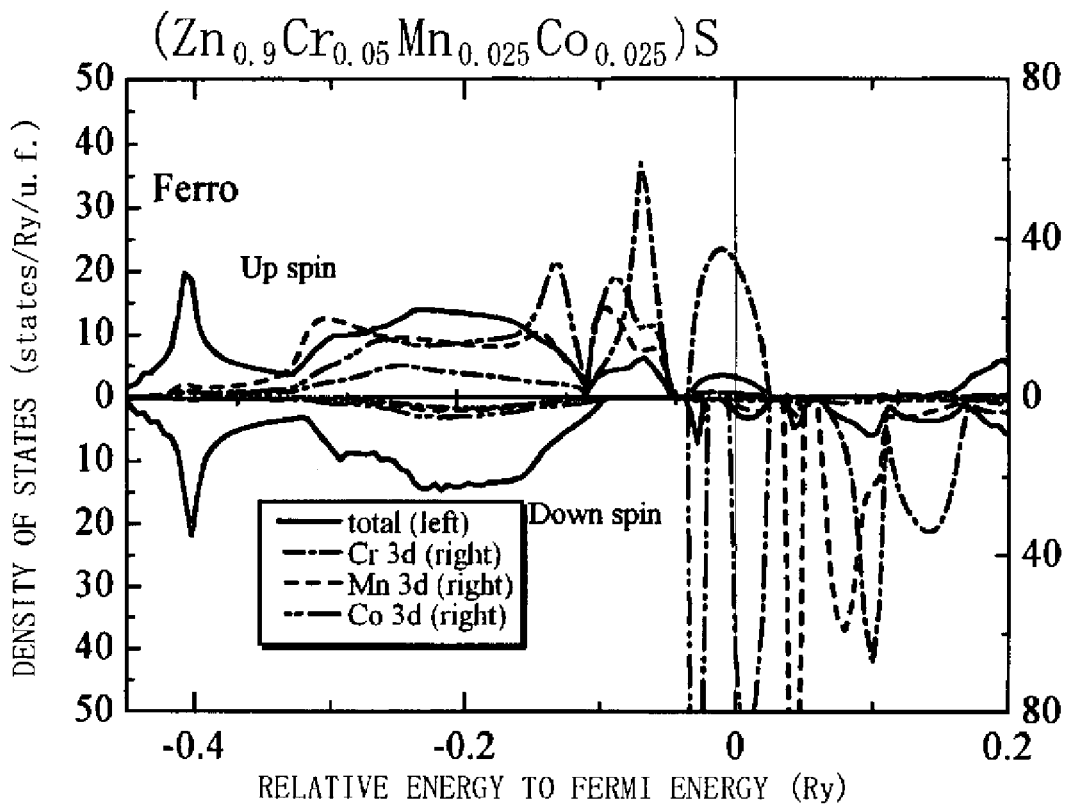
FIG. 17 is a graph showing electronic densities of states of the above semiconductor in a ferromagnetic state.
Figure 18:
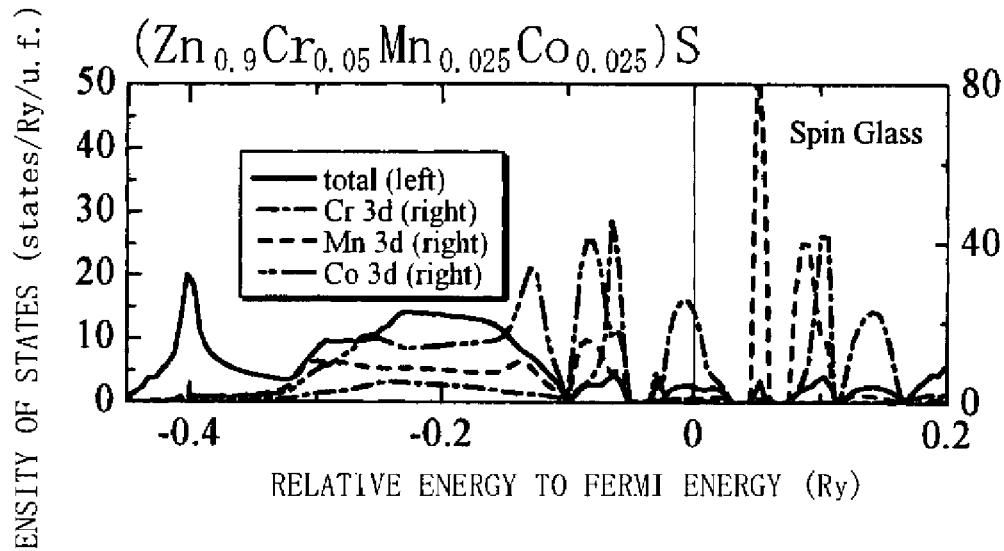
FIG. 18 is a graph showing electronic densities of states of the above semiconductor in a spin glass state.

FIG. 16 through FIG. 18 show density-of-states curves in an antiferromagnetic state, a ferromagnetic state and a spin glass state, respectively, obtained by the first-principles electronic state calculations. In the drawings, solid lines represent a total density of states, one-dot chain lines a local density of states of Cr at a 3 d orbital position, broken lines a local density of states of Mn at a 3 d orbital position, and two-dot chain lines a local density of states of Co at a 3 d orbital position. FIG. 18 shows only density-of-states curves of up spin electrons in the spin glass state. Density-of-states curves of down spin electrons are the same as those of the up spin electrons, and therefore not shown.

In the antiferromagnetic state, as indicated by solid lines in FIG. 16, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

In contrast, in the ferromagnetic state, as indicated by solid lines in FIG. 17, both the up spin electrons and down spin electrons have a density of states greater than zero near the Fermi energy, so that it can be said that half-metallicity is not exhibited.

Also in the spin glass state, as indicated by a solid line in FIG. 18, the up spin electrons have a density of states grater than zero near the Fermi energy. The down spin electrons also have a density of states grater than zero near the Fermi energy, so that it can be said that half-metallicity is not exhibited.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

The present inventors have confirmed with first-principles electronic state calculations that an antiferromagnetic half-metallic semiconductor can be obtained also by adding to ZnS three types of magnetic elements of V, Mn and Fe.

Eighth Embodiment

A diluted antiferromagnetic half-metallic semiconductor of the present embodiment is represented by a composition formula $(Ti_{0.9}Mn_{0.05}Co_{0.05})O_2$, and has a part of an element Ti of an oxide semiconductor of $TiO_2$ substituted with transition metal elements of Mn and Co. $TiO_2$ has a rutile-type crystal structure.

A manufacturing method for the diluted antiferromagnetic half-metallic semiconductor includes growing a $TiO_2$ thin film on a GaAs(100) substrate with a laser MBE method, and simultaneously adding 5% each of Mn and Co.

The present inventors performed first-principles electronic state calculations, as in the first embodiment, in order to confirm that the above manufacturing method exhibits half-metallicity and antiferromagnetism.

Figure 19:
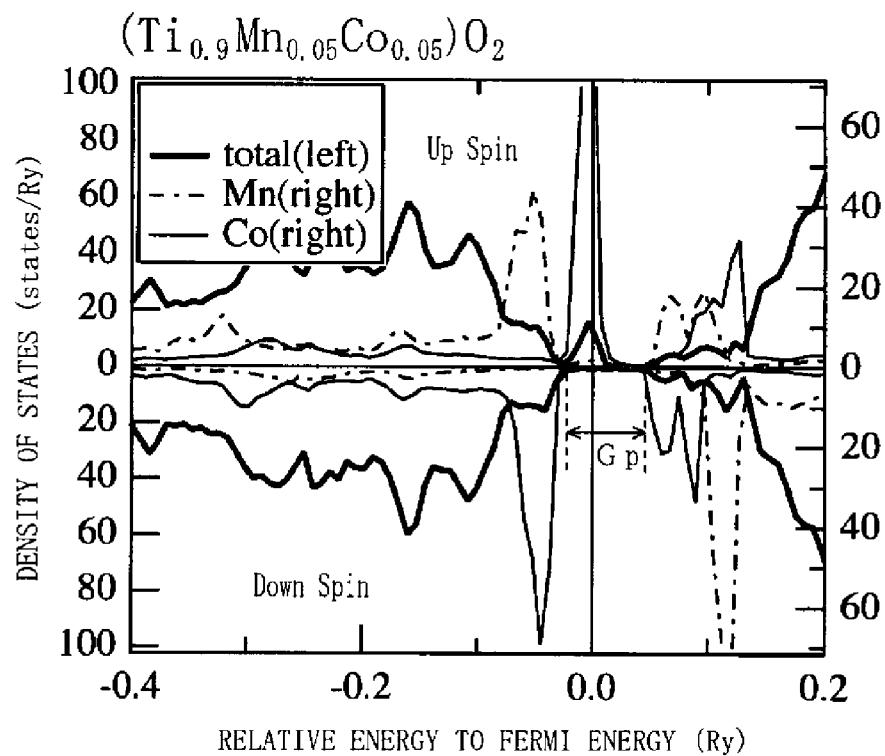
FIG. 19 is a graph showing electronic densities of states of a semiconductor represented by a composition formula $(Ti_{0.9}Mn_{0.05}Co_{0.05})O_2$ in an antiferromagnetic state.

FIG. 19 shows density-of-states curves in an antiferromagnetic state obtained by the first-principles electronic state calculations. In the drawing, thicker solid lines represent a total density of states, one-dot chain lines a local density of states of Mn at a 3 d orbital position, and thinner solid lines a local density of states of Co at a 3 d orbital position. In the antiferromagnetic state, as indicated by the thicker solid lines in the drawing, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

When a sum total of electron energy in each of the antiferromagnetic state, ferromagnetic state and spin glass state was calculated, the energy was the lowest in the antiferromagnetic state. Therefore, it can be said that the antiferromagnetic state is the most stable to exhibit antiferromagnetism.

The present inventors have confirmed with first-principles electronic state calculations that an antiferromagnetic half-metallic semiconductor can be obtained also by adding to $TiO_2$ two types of magnetic elements of Fe and Co, or two types of magnetic elements of Cr and Co.

Figure 20:
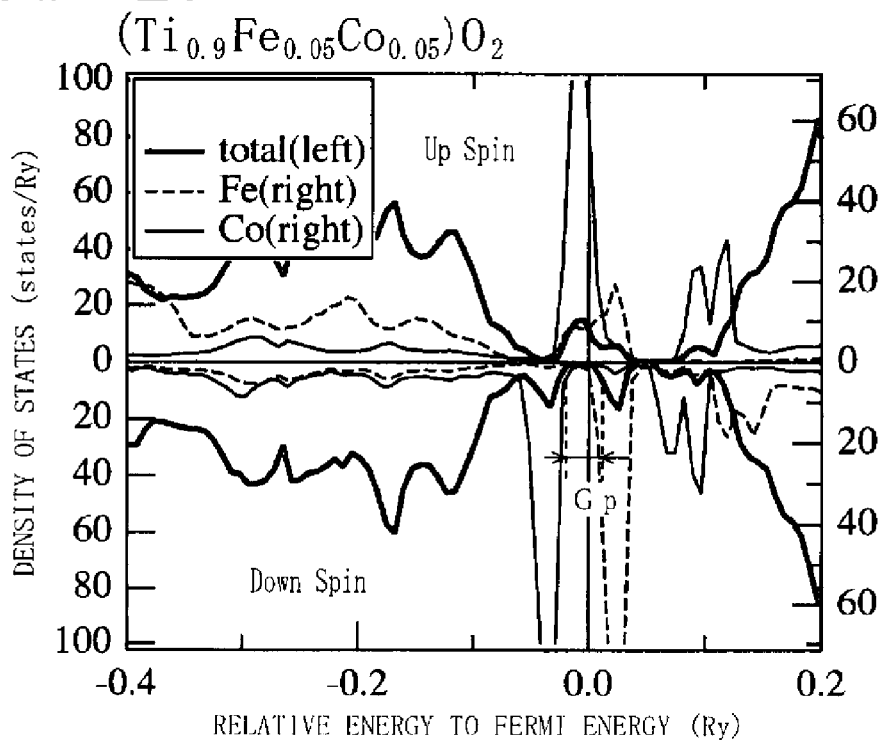
FIG. 20 is a graph showing electronic densities of states of a semiconductor represented by a composition formula $(Ti_{0.9}Fe_{0.05}Co_{0.05})O_2$ in an antiferromagnetic state.

FIG. 20 shows density-of-states curves in an antiferromagnetic state obtained by first-principles electronic state calculations for a semiconductor represented by a composition formula $(Ti_{0.9}Fe_{0.05}Co_{0.05})O_2$. In the drawing, thicker solid lines represent a total density of states, one-dot chain lines a local density of states of Mn at a 3 d orbital position, and thinner solid lines a local density of states of Co at a 3 d orbital position. In the antiferromagnetic state, as indicated by the thicker solid lines in the drawing, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

When a sum total of electron energy in each of the antiferromagnetic state, ferromagnetic state and spin glass state was calculated, the energy was the lowest in the antiferromagnetic state.

Figure 21:
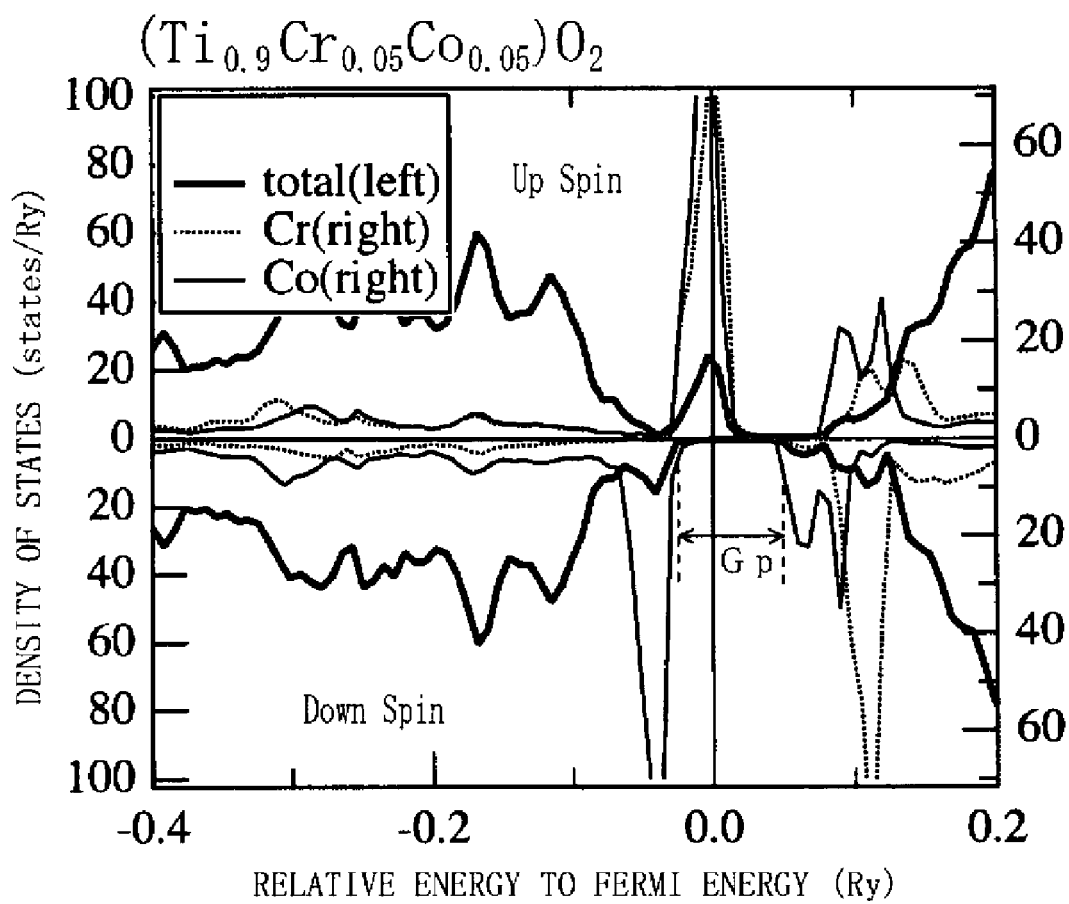
FIG. 21 is a graph showing electronic densities of states of a semiconductor represented by a composition formula $(Ti_{0.9}Cr_{0.05}Co_{0.05})O_2$ in an antiferromagnetic state.

FIG. 21 shows density-of-states curves in an antiferromagnetic state obtained by first-principles electronic state calculations for a semiconductor represented by a composition formula $(Ti_{0.9}Cr_{0.05}Co_{0.05})O_2$. In the drawing, thicker solid lines represent a total density of states, dotted lines a local density of states of Cr at a 3 d orbital position, and thinner solid lines a local density of states of Co at a 3 d orbital position. In the antiferromagnetic state, as indicated by the thicker solid lines in the drawing, the down spin electrons have a density of states of zero to form a band gap Gp. The Fermi energy is present in the band gap. On the other hand, the up spin electrons have a density of states greater than zero near the Fermi energy. Thus, it can be said that half-metallicity is exhibited.

When a sum total of electron energy in each of the antiferromagnetic state, ferromagnetic state and spin glass state was calculated, the energy was the lowest in the antiferromagnetic state.

FIG. 19 through FIG. 21 show the calculation result in the case of adding two types of magnetic elements to a rutile-type $TiO_2$. A rutile-type $TiO_2$ and an anatase-type $TiO_2$ have approximately the same electronic state. Therefore, it can be said that an antiferromagnetic half-metallic semiconductor can be obtained by adding two types of magnetic elements to an anatase-type $TiO_2$.

The invention claimed is:

1. An antiferromagnetic half-metallic semiconductor manufactured by adding to a semiconductor two or more types of magnetic elements including a magnetic element with a number of d-electrons of less than or equal to five and a magnetic element with a number of d-electrons of more than or equal to five, and substituting a part of elements of the semiconductor with the two or more types of magnetic elements.

2. The antiferromagnetic half-metallic semiconductor according to claim 1, wherein two types of magnetic elements are added, wherein a number of d-electrons of one magnetic element is the same or approximately the same as a number of positive holes of the other magnetic element.

3. The antiferromagnetic half-metallic semiconductor according to claim 2, wherein the two types of magnetic elements are any one combination selected from the group of Ti and Ni, V and Co, Cr and Fe, Ti and Fe, Ti and Co, V and Fe, V and Ni, Cr and Co, Cr and Ni, Mn and Fe, Mn and Co, V and Mn, and Cr and Mn.

4. The antiferromagnetic half-metallic semiconductor according to claim 1, wherein three types of magnetic elements are added, wherein a total number of d-electrons of any two types of magnetic elements is the same or approximately the same as a number of positive holes of one type of magnetic element other than the two types of magnetic elements.

5. The antiferromagnetic half-metallic semiconductor according to claim 4, wherein the three types of magnetic elements are any one combination selected from the group of Ti, V, and Ni, Ti, V, and Co, Ti, Ni, and Co, V, Ni, and Co, Cr, Mn, and Co, and V, Mn, and Fe.

6. The antiferromagnetic half-metallic semiconductor according to any of claims 1 to 5, wherein the semiconductor is a II-VI compound semiconductor or a III-V compound semiconductor, and a II element of the II-VI compound semiconductor or a III element of the III-V compound semiconductor is substituted with the magnetic elements.

7. The antiferromagnetic half-metallic semiconductor according to claim 6, wherein the semiconductor is any one type of compound semiconductor selected from the group of ZnO, ZnSe, ZnS, ZnTe, CdTe, GaAs, GaN, InAs, AlAs, InSb, GaSb, GaP, and InP.

8. The antiferromagnetic half-metallic semiconductor according to any of claims 1 to 5, wherein the semiconductor is a compound semiconductor or II-VI-V compound semiconductor having a chalcopyrite-type crystal structure, and a III element of the I-III-VI compound semiconductor or a II element of the II-VI-V compound semiconductor is substituted with the magnetic elements.

9. The antiferromagnetic half-metallic semiconductor according to claim 8, wherein the semiconductor is any one type of compound semiconductor selected from the group of CuAlS2, AgCaS2, CdGeP2, ZnGeP2, CdGeAs2, and AgGaS2.

10. The antiferromagnetic half-metallic semiconductor according to any of claims 1 to 5, wherein the semiconductor is an oxide semiconductor.

11. A manufacturing method for an antiferromagnetic half-metallic semiconductor, comprising growing a semiconductor thin film on a substrate, and simultaneously adding two or more types of magnetic elements including a magnetic element with a number of d-electrons of less than five and a magnetic element with a number of d-electrons of more than five.

* * * * *